United States Patent
Burdalski et al.

(10) Patent No.: US 8,314,565 B2
(45) Date of Patent: Nov. 20, 2012

(54) SOLID STATE LED BRIDGE RECTIFIER LIGHT ENGINE

(75) Inventors: Robert J. Burdalski, Lumberton, NJ (US); Joseph B. Mazzochette, Cherry Hill, NJ (US)

(73) Assignee: Lighting Science Group Corporation, Satellite Beach, FL (US)

( * ) Notice: Subject to any disclaimer, the term of this patent is extended or adjusted under 35 U.S.C. 154(b) by 45 days.

(21) Appl. No.: 12/504,338

(22) Filed: Jul. 16, 2009

(65) Prior Publication Data

US 2009/0289267 A1 Nov. 26, 2009

Related U.S. Application Data

(62) Division of application No. 11/443,535, filed on May 30, 2006, now abandoned.

(60) Provisional application No. 60/685,680, filed on May 27, 2005.

(51) Int. Cl.
*H05B 37/00* (2006.01)

(52) U.S. Cl. ......... 315/185 S; 315/247; 315/207; 315/200 R; 315/312

(58) Field of Classification Search ......... 315/81, 315/88, 79, 99, 100, 103, 185 S, 247, 207, 315/200 R, 312–326
See application file for complete search history.

(56) References Cited

U.S. PATENT DOCUMENTS

| | | | | |
|---|---|---|---|---|
| 4,177,413 A | * | 12/1979 | Ascoli | 320/108 |
| 4,412,160 A | * | 10/1983 | Kojima et al. | 318/280 |
| 4,438,474 A | * | 3/1984 | Paice | 361/58 |
| 4,460,863 A | * | 7/1984 | Conforti | 320/160 |
| 4,769,596 A | | 9/1988 | Faucett | |
| 4,794,948 A | | 1/1989 | Schempp | |
| 5,986,434 A | * | 11/1999 | Roy et al. | 320/128 |
| 5,998,925 A | | 12/1999 | Shimizu et al. | |
| 6,149,283 A | | 11/2000 | Conway et al. | |
| 6,653,822 B2 | * | 11/2003 | Duerbaum | 323/207 |
| 7,025,473 B2 | * | 4/2006 | Dokoupil | 362/640 |
| 7,138,770 B2 | | 11/2006 | Uang et al. | |
| 7,267,460 B2 | * | 9/2007 | Lefferson | 362/371 |
| 7,276,858 B2 | | 10/2007 | Allen | |
| 7,560,820 B2 | * | 7/2009 | Amiotti et al. | 257/788 |
| 2002/0043943 A1 | * | 4/2002 | Menzer et al. | 315/291 |
| 2002/0180345 A1 | | 12/2002 | Hen | |
| 2005/0053368 A1 | * | 3/2005 | Pesu et al. | 392/390 |

(Continued)

FOREIGN PATENT DOCUMENTS

JP 5-198843 8/1993

(Continued)

OTHER PUBLICATIONS

PCT Search Report for International Application No. PCT/US2006/020977; International Filing Date: May 30, 2006; Date of Mailing: May 20, 2008; 3 pgs.

*Primary Examiner* — Tuyet Thi Vo

(74) *Attorney, Agent, or Firm* — Cantor Colburn LLP

(57) ABSTRACT

A solid-state light engine comprised of light emitting diodes (LEDs) configured into a bridge rectifier with a current limiting module coupled to the LED bridge rectifier. The light engine may be packaged for high temperature operation. Optionally, the LEDs comprise wavelength-converting phosphors with a persistence that is a multiple of the peak to peak current period, to smooth and mask ripple frequency pulsation of emitted light.

10 Claims, 20 Drawing Sheets

U.S. PATENT DOCUMENTS

| | | | |
|---|---|---|---|
| 2005/0224830 A1* | 10/2005 | Blonder et al. | 257/100 |
| 2006/0006405 A1 | 1/2006 | Mazzochette | |
| 2006/0071806 A1* | 4/2006 | Hollnberger et al. | 340/815.45 |
| 2006/0114201 A1 | 6/2006 | Chang | |
| 2006/0138971 A1* | 6/2006 | Uang et al. | 315/291 |
| 2006/0158130 A1* | 7/2006 | Furukawa | 315/200 R |
| 2007/0217210 A1* | 9/2007 | Jeong et al. | 362/428 |
| 2007/0273296 A9 | 11/2007 | Janning | |
| 2007/0273299 A1 | 11/2007 | Miskin et al. | |
| 2008/0211421 A1* | 9/2008 | Lee et al. | 315/250 |
| 2008/0259597 A1* | 10/2008 | Safford et al. | 362/231 |

FOREIGN PATENT DOCUMENTS

| | | |
|---|---|---|
| SU | 1713052 | 2/1992 |

\* cited by examiner

SOLID STATE LED BRIDGE RECTIFIER LIGHT ENGINE

CROSS REFERENCE TO RELATED APPLICATIONS

This application is a divisional of U.S. patent application Ser. No. 11/443,535 entitled "Solid State LED Bridge Rectifier Light Engine" filed on May 30, 2006 which claims the benefit of U.S. Provisional Patent Application No. 60/685,680, filed May 27, 2005, the entire disclosure of which is hereby incorporated by reference herein.

BACKGROUND OF THE INVENTION

1. Field of the Invention

Embodiments of the invention relate to a solid-state light engine that is directly compatible with alternating current (AC) input power, without the need for a separate rectification module, but that can also alternatively be powered by direct current (DC) input power.

2. Related Art

In many lighting applications, solid-state light engines are superior to conventional incandescent lamps. Beneficially, solid-state light engines can, in certain circumstances, achieve an almost 20% improvement in efficiency and an extended lifetime (e.g. exceeding 50,000 hours) as compared to incandescent lamps.

Traditional solid-state light engines are powered by a direct current or pulsating direct current drive. As such, to drive the light engine using an AC power source, the AC input line must first be conditioned. Power-conditioning commonly involves the rectification of AC input power, typically achieved by inserting rectifier diodes in a bridge configuration, as well as a means of limiting current, such as a series resistance or reactance in the power path. However, the addition of such electronic components into the power path may increase manufacturing costs and complexity, and can cause a decrease in the lifetime (or time to failure) of the light engine, and can decrease efficiency due to power loss.

To avoid the performance-related issues caused by the insertion of power conditioning elements into the power path, some standard solid-state light engines are powered directly from the AC line. However, the direct AC powering of a light engine causes the light output to pulsate at the frequency of the AC power source, typically in the range of 50 to 60 Hz. This line frequency pulsation can produce eye fatigue or annoyance when viewed, even in cases where the engine is viewed for a short period of time.

Accordingly, there is a need for a solid state light engine that is directly compatible with an AC input power source, which does not exhibit the deleterious pulsation effects generated by a direct AC powering arrangement, and/or which does not require the use of separate power conditioning or rectification circuitry.

SUMMARY OF THE INVENTION

Embodiments of the invention satisfy these and other needs. Embodiments of the invention relate to a solid state bridge rectifier light engine arrangement that may be powered directly by an AC input line, without the need for further power conditioning. Although fullwave bridge rectifiers are known in the art, they utilize non-light emitting diodes, and are used to convert AC current to DC current for use as a power source for external electronic components, not to produce useful illumination. Similarly, although the use of LEDs for illumination is known in the art, LEDs are typically powered by a DC power source. The present invention advantageously uses LEDs in a novel way by configuring them into a bridge rectifier to produce useful light directly from an AC power source without the need for separate rectification or other conditioning of the input power.

More specifically, embodiments of the invention provide for a solid state light engine arrangement that includes a full wave bridge rectifier configuration of light emitting diodes (LEDs) directly compatible with an AC power input, which may advantageously also be connected to a current limiting element. An added benefit to this configuration is that the light engine may be constructed with two sets of terminals for connection to a power source, so that the user has the option of powering the light engine by either AC power or the more traditional DC power, depending on the terminals to which the user connects the power source.

Embodiments of the invention can also include a solid-state LED bridge rectifier circuit advantageously using phosphors to further smooth any frequency pulsation or ripple of light emitted from the light engine. The LED bridge rectifier can include one or more LEDs configured such that the LED bridge rectifier receives and rectifies an AC power signal and emits light. The current limiting module can be used to protect the LEDs by limiting the current passing through the LEDs within the LED bridge rectifier. The LEDs can emit any of a number of colors of light, depending on the type of LED used. Advantageously, LEDs that emit of blue and/or ultraviolet wavelength emissions can be used, in combination with wavelength converting phosphors known in the art, to create light that is perceived as white light by a user. See, for example, U.S. Pat. No. 5,998,925 to Shimizu. The converting phosphor can be particles of Cerium activated Yttrium Aluminum Garnet (YAG:Ce) or Europium activated Barium Orthosilicates (BOSE).

The turn-on and turn-off time for typical LEDs is in the tens to one hundred nanosecond range. With this response time, LEDs will virtually follow the low frequency AC waveform without delay. According to an aspect of an embodiment of the invention, through rectification, the light pulsation or ripple frequency will typically be increased to approximately twice the frequency of the input AC line current (e.g., 100 to 120 Hz). This frequency doubling has the advantageous effect of speeding up the light pulsation to a frequency beyond what is typically perceptible to human observers, thus making it more appealing for use in standard lighting applications than would an LED array powered directly from AC current that was not configured into a bridge rectifier. In addition, the frequency doubling that occurs in the LED bridge rectifier configuration results in a shortening of the time duration between current peaks to about 10 ms for a 50 Hz line and about 8 ms for a 60 Hz line. The shortened peak to peak period, together with the advantageous use of phosphors having a persistence of 5 to 10 times that duration, masks the light pulsation or flicker, allowing it to be smoothed and integrated into a nearly continuous white light output. Phosphors having a longer or shorter persistence nay also be used advantageously.

The light engine arrangement according to certain embodiments of the invention can be used as a solid-state replacement for conventional Edison-base incandescent lamps or as a replacement for low-voltage halogen lamps or other low voltage lamps. Advantageously, since no additional electronic components need be inserted into the power path, the increased useful life offered by the solid state light engine need not be compromised.

BRIEF DESCRIPTION OF THE DRAWING

The invention can be understood from the detailed description of exemplary embodiments presented below, considered in conjunction with the attached drawings, of which.

It is to be understood that the attached drawings are for purposes of illustrating the concepts of the invention and may not be to scale.

DETAILED DESCRIPTION OF THE INVENTION

Embodiments of the invention are directed to a solid state light engine producing white or near white light that is constructed by using LEDs that emit blue or ultraviolet wavelength emission which stimulates a phosphor, or some mixture of phosphors, that emit light in the green, yellow and/or red wavelengths. The combination of all these wavelengths is perceived as white light by the human eye. If one were to look at just a monochrome color LED driven with an AC source, one would see the pulsation of the light at the 50 Hz or 60 Hz frequencies. Even if the pulsation is above the detectable threshold to 100 Hz or 120 Hz, the pulsation can still be detected when the light interacts with objects or images moving or pulsating at close to the LED pulse rate or harmonics of that rate. This is, at the least, annoying and, at worst, potentially dangerous. Strobing light could possibly make moving or spinning objects appear to be not moving at all. An example of this is a fluorescent light source flickering at line frequency illuminating strobe marks on a turntable.

Figure 1:
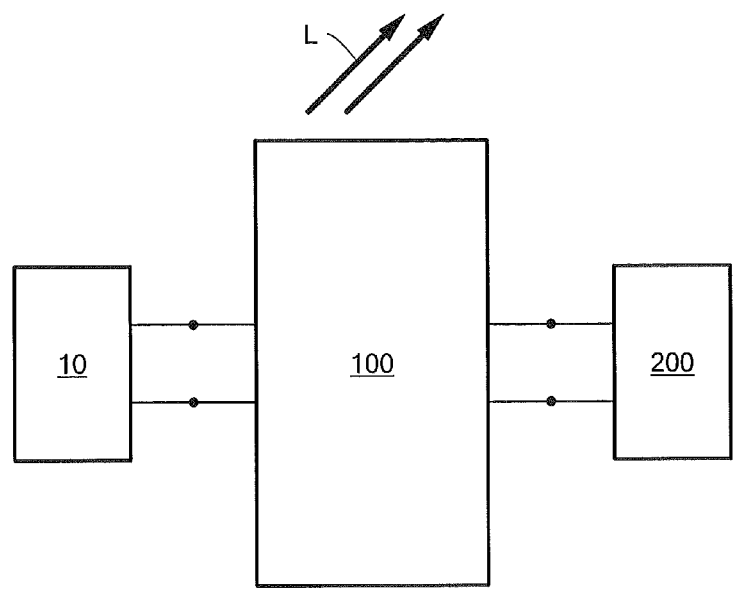
FIG. 1 is a basic schematic of a solid state light engine in accordance with embodiments of the invention.

With reference to FIG. 1, there is shown a solid-state light engine comprising an LED bridge rectifier 100 coupled to an optional current limiting module 200. The LED bridge rectifier is coupled to, and powered by, power supply module 10. LED bridge 100, comprising LEDs, emits light L, thus providing a usable light source.

Figure 2:
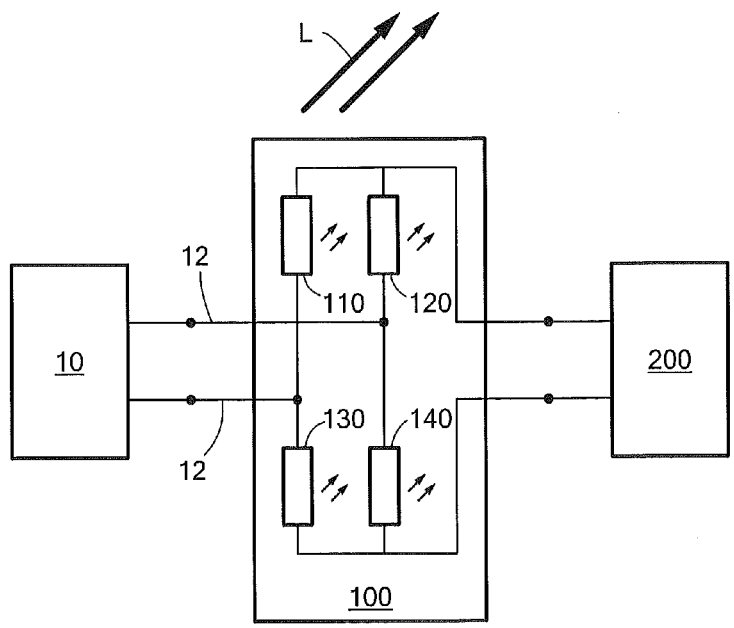
FIG. 2 is a more detailed schematic of a solid state light engine, in accordance with embodiments of the invention.

With reference to FIG. 2, LED bridge rectifier 100 is shown in greater detail. Specifically, LED bridge rectifier 100 can comprise four bridge legs 110, 120, 130, 140, each leg preferably including two or more LEDs. As such, in embodiments of the invention, each of legs 110, 120, 130 and 140 can emit light when supplied with power at input 12 from AC power supply module 10.

Figure 3:
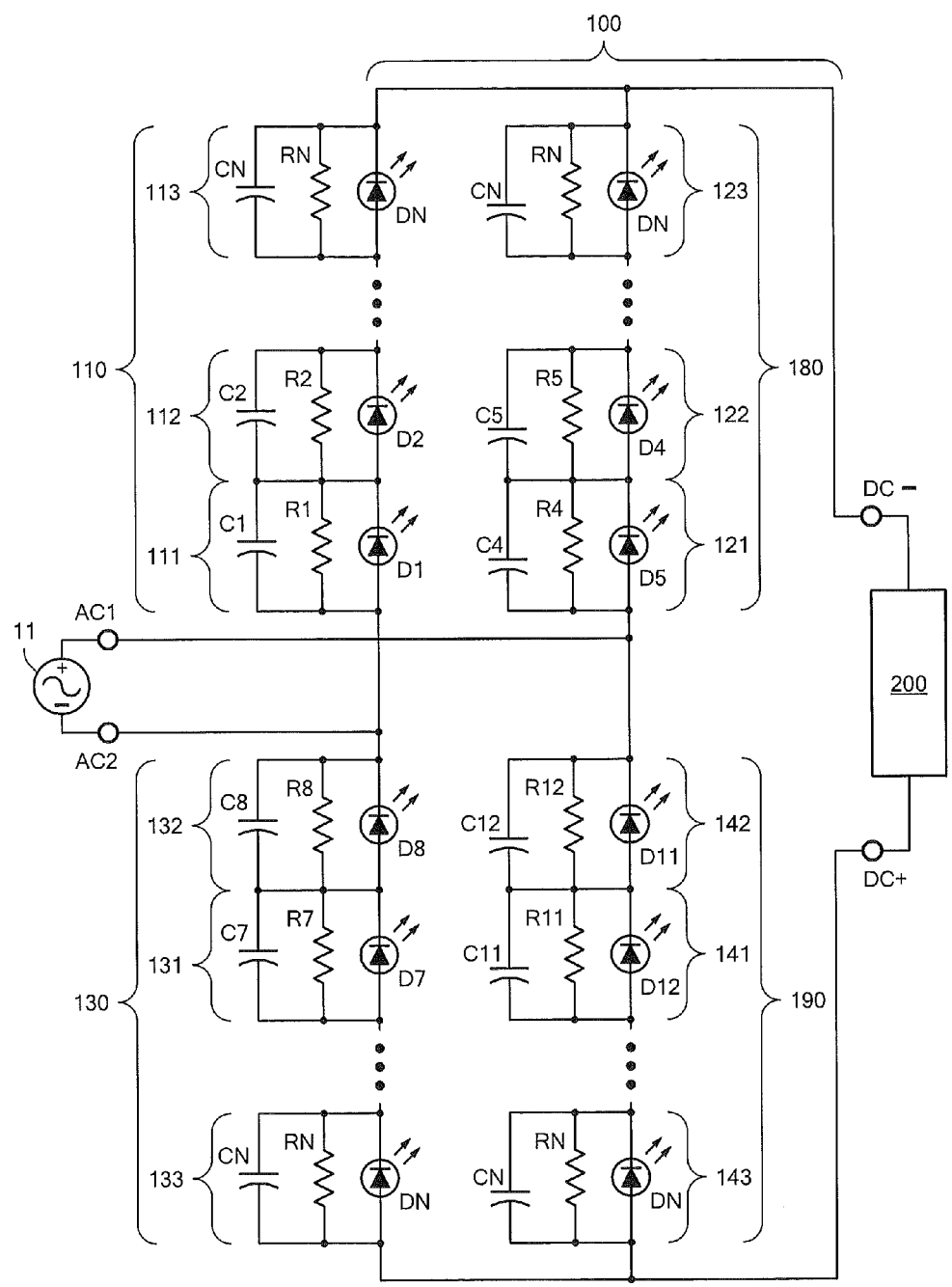
FIG. 3 is a circuit diagram of a solid state light engine, in accordance with embodiments of the invention.

FIG. 3 illustrates an exemplary embodiment of the invention in further detail. According to this embodiment, LED bridge rectifier 100 includes a full wave bridge configuration, with each of the bridge legs 110, 120, 130, 140 including LED modules 111, 112, 113, 121, 122, 123, 131, 132, 133, 141, 142 and 143. Although FIG. 3 depicts three LEDs in each bridge leg, the LED bridge rectifier may be configured to include one or more multiple LEDs in each bridge leg. The number of LEDs (N) in any bridge leg may be determined by the desired luminous output and the input sinusoidal peak voltage of an AC power source applied between AC1 and AC2. The current limiting module 200 is connected to the rectified DC output of the LED bridge rectifier. Although as shown in FIG. 3 the current limiting module 200 is external in this embodiment, alternatively, it may be integrated into the light engine package (LED bridge rectifier 100).

The reverse voltage seen by each leg 110, 120, 130, 140 of the bridge module 100 is represented by the following equation:

$$V_{rT} = V_{in}(RMS) * \sqrt{2}.$$

Accordingly, the reverse voltage seen by each led module 111, 112, 113, 121, 122, 123, 131, 132, 133, 141, 142, 143 of the bridge leg 110, 120, 130, 140 is represented by the following equation:

$$V_{rd} = V_{rT}/N;$$

where N is the number of LED modules (LEDs) in a bridge leg 110, 120, 130, 140.

Since typical LEDs do not have the capacity to withstand high reverse voltages, the number of LEDs in the array can be chosen to limit the reverse voltage on each LED to a safe (i.e., not damaging to the LEDs) level, as would be known to one of skill in the art, as informed by the present disclosure. In addition, because individual LEDs may exhibit differing leakage current levels under the same reverse voltage, in some embodiments, a shunt resistance or reactance network can be used to assure the total reverse voltage is distributed equally, as illustrated in FIG. 3.

Figure 4:
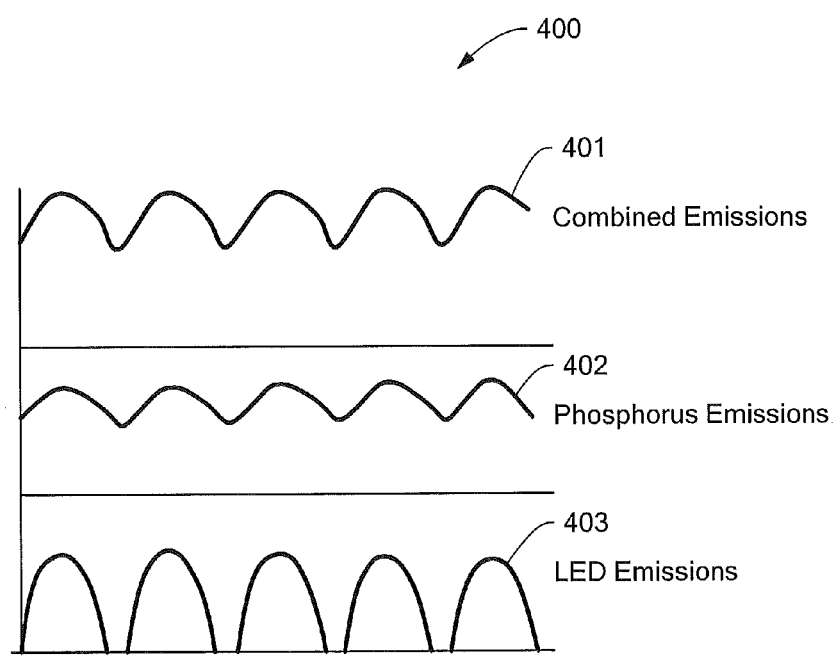
FIG. 4 is a graphical representation of the emissions of various structures.

With reference to FIG. 4, as is depicted in the graphical representation 400, the above described arrangement of elements produces a pulsating emission from the LEDs 403 such that the pulsed emission is twice the input AC line frequency (100 Hz or 120 Hz). If the LEDs make use of phosphors, the phosphor particles becomes excited by each light pulse. The phosphor is chosen such that, besides its photometric and wavelength-converting characteristics, it preferably has a persistence (time constant) of greater than 40 ms. Thus, the phosphor emission can persist while the LEDs are in the low output and off portion of their emission 402. The end effect is perceived as white light emission without perceptible pulsation 401. The phosphor particles preferably have effective diameters smaller than 100 microns, and more preferably, in the range 0.01 to 100 microns.

Figure 4A:
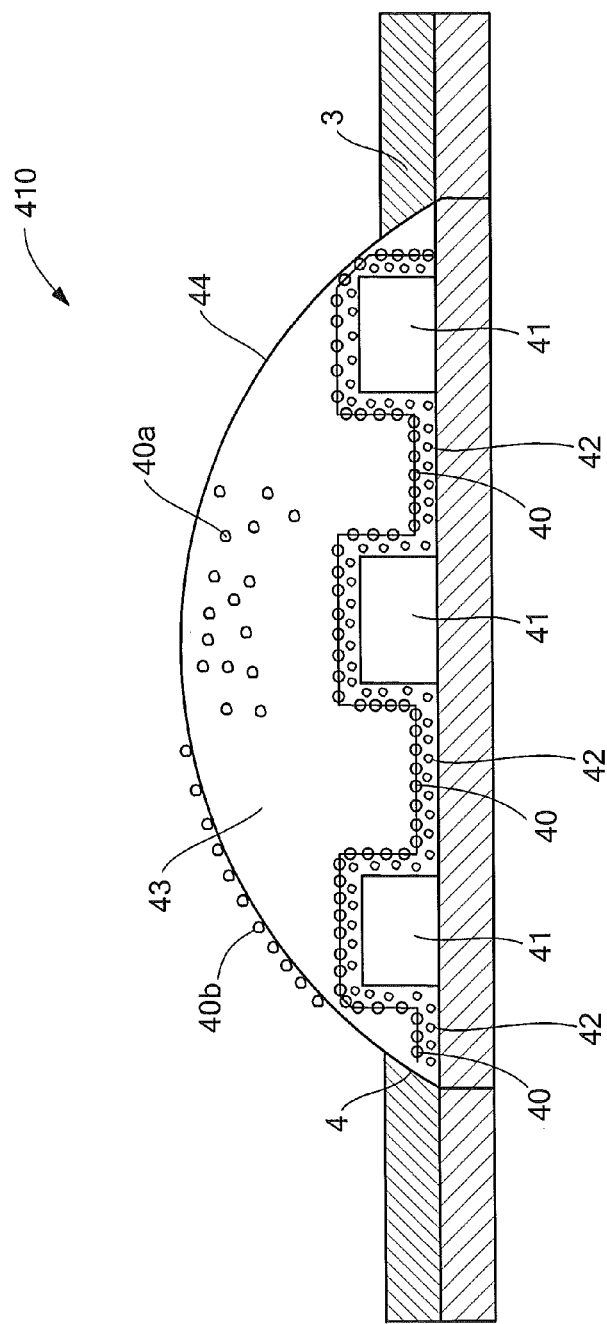
FIG. 4a is a diagram showing alternative exemplary dispositions of phosphor particles for use with LEDs in the present invention.

The phosphors can be disposed within a packaged LED array in several ways. Typically, in packaged LED assemblies, each LED die is encapsulated in an epoxy or silicone to protect the die from the environment, and optionally to serve as an optical element that may focus or otherwise direct the emitted light. Phosphor particles may be utilized in the LED package in a number of ways. For example, as can be seen in FIG. 4a, in an LED package 410, the phosphor particles 40 may be applied directly to the LED die 41 before the encapsulant 43 is applied, the phosphor particles forming a thin layer bonded to the LED die 41 by a layer of tacky uncured phosphor free resin 42 that is later cured. The preferred tacky transparent materials include but are not limited to partially cured silicones or fully cured gel-like silicones with high refractive index (e.g., GE Silicones IVS5022 or Nusil Gel-9617-30). The silicones can include micro amino emulsions, elastomers, resins and cationics. Other useful polymeric resins include butyrals, cellulosic, silicone polymers, acrylate compounds, high molecular weight polyethers, acrylic polymers, co-polymers, and multi-polymers. The index of refraction of the above-mentioned materials can be tailored for optical matching.

Alternatively, the phosphors particles 40a may be dispersed in the encapsulant 44, or applied overlying the encapsulant 44, either directly applied in a layer 40b to the outer surface of the encapsulant, or (not shown) in a second layer that may comprise an optical element.

Figure 5:
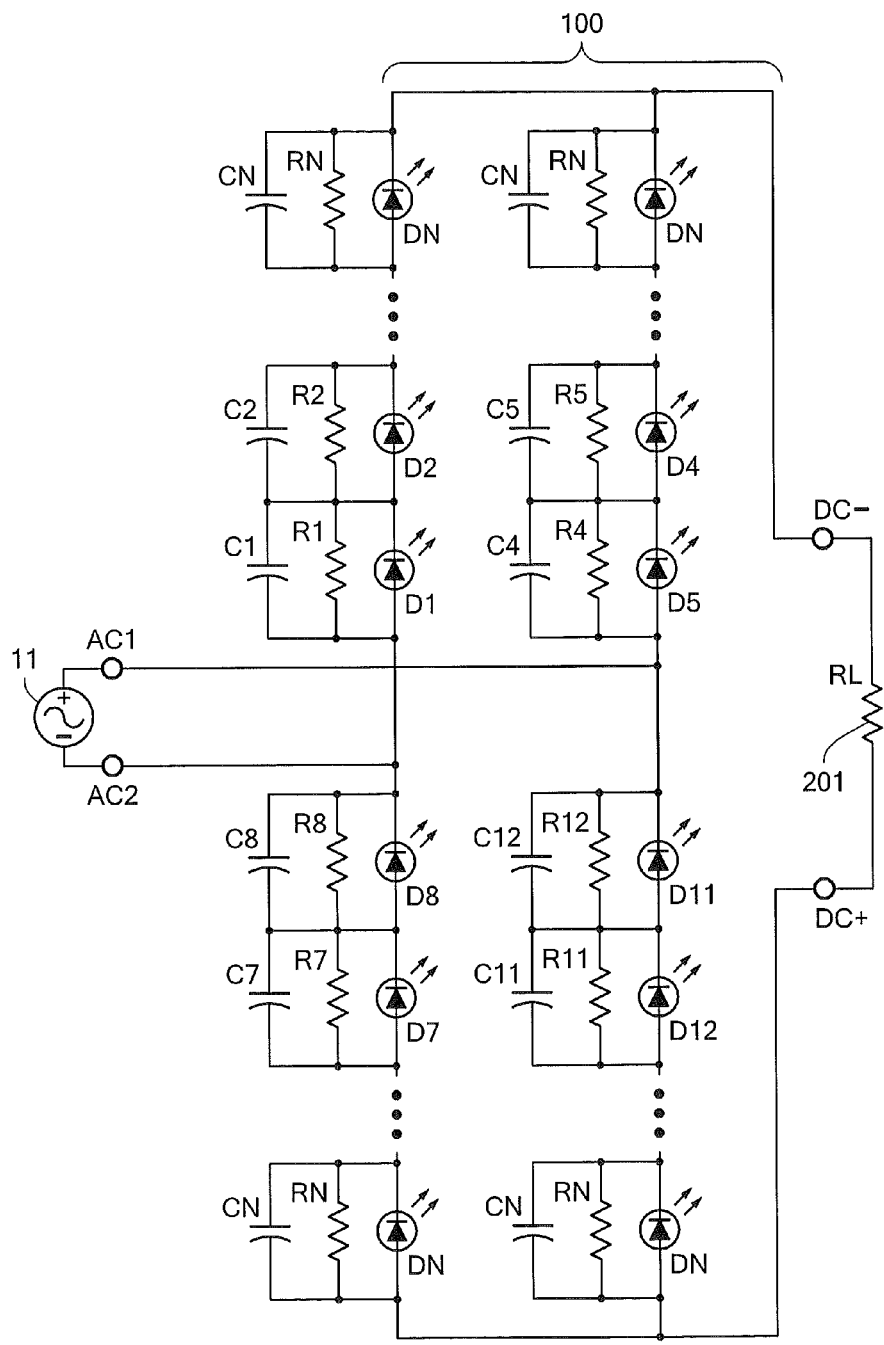
FIG. 5 is a circuit diagram of a solid state light engine, in accordance with embodiments of the invention.
Figure 6:
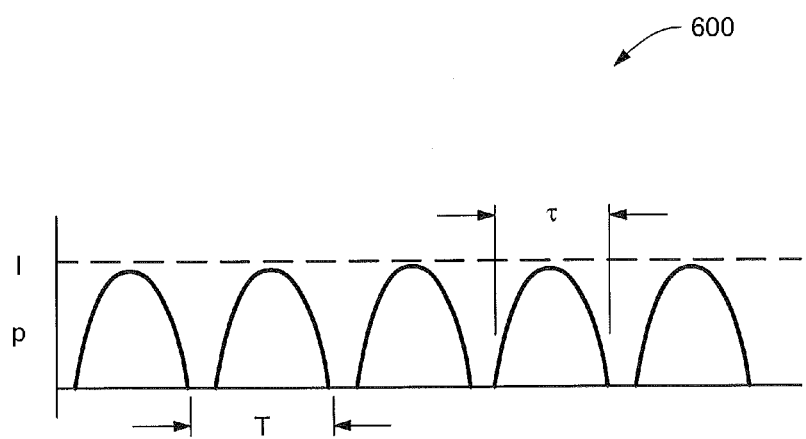
FIG. 6 is a graphical. representation of peak current through a device, in accordance with embodiments of the invention.

As illustrated in FIG. 5, and with continued reference to FIG. 3, according to an embodiment of the invention, current limiting module 200 can comprise a single resistor 201 used to set the peak current for a given input voltage. According to an exemplary embodiment of the invention, the peak current per bridge leg 110, 120, 130, 140 may be set to:

$$I_{jPeak} = (I_{dDC} * 1.57)/du$$

Where du, or duty factor, is the conduction time (π) divided by the total period (T).

$$du = \tau/T,$$

as is illustrated by graphical representation 600 of FIG. 6. The resistor value (R) of resistor $R_L$ is determined by the following equation:

$$R = (V_{in}(\text{Peak}) - V_{ft})/I_{jPeak}.$$

Alternative embodiments of the invention are depicted in FIGS. 7 to 11, each embodiment including a different exemplary current limiting module 200 for use in the solid state light engine arrangement of the invention. In all embodiments, the current limiting module 200 can be applied external to the light engine, or, alternatively, it may be integrated into the light engine package (i.e., LED bridge 100).

Figure 7:
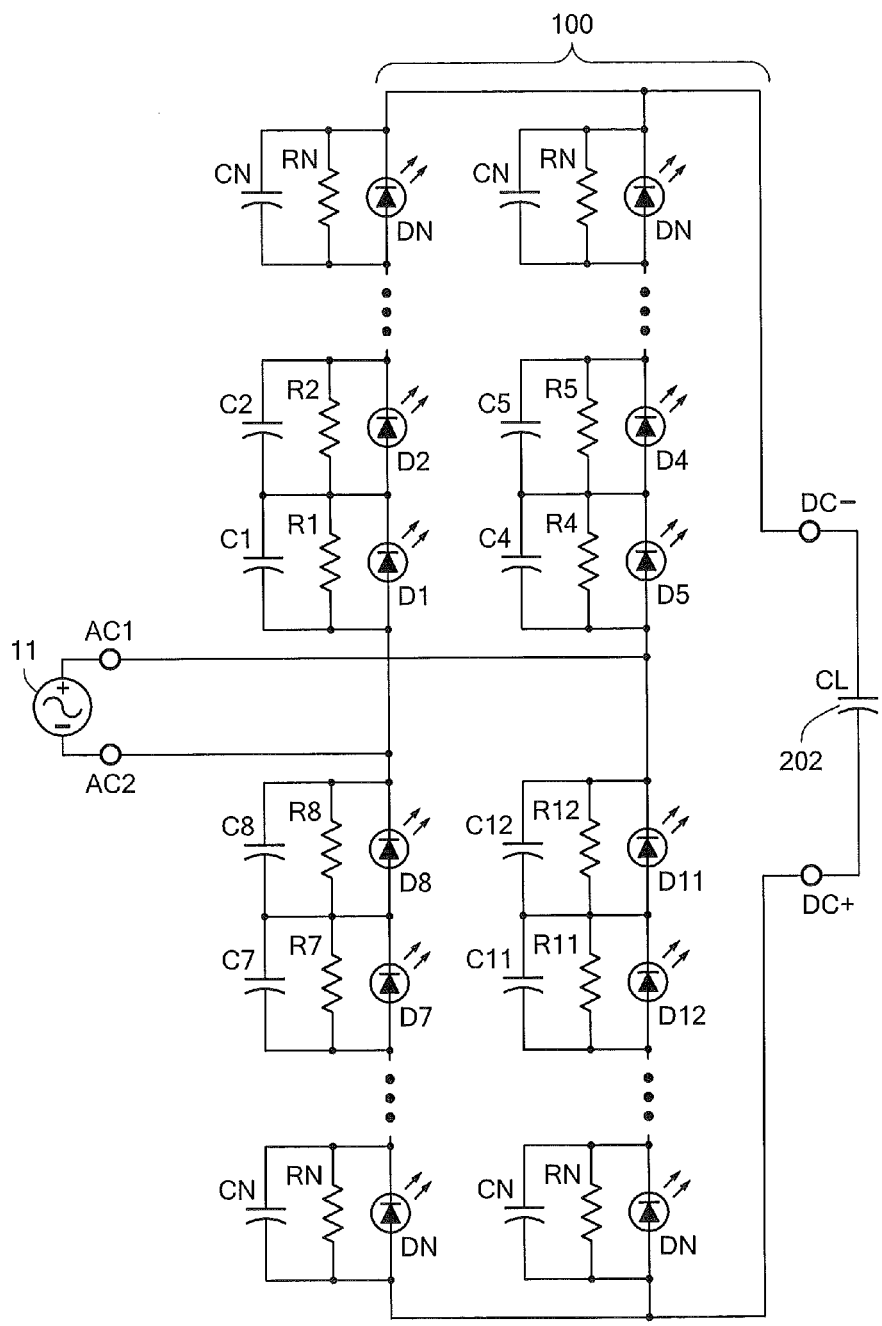
FIGS. 7-11 are circuit diagrams of solid state light engines, each having a different current limiting module attached thereto, in accordance with embodiments of the invention.

FIG. 7 depicts an implementation wherein current limiting module 200 is configured such that the resistive element $R_L$ of FIG. 3 is replaced with a capacitor $C_L$ 202, thereby forming a "lossless" current limiting element, wherein the reactance at the line frequency equivalent to the required resistance is given by the following equation:

$$R = X_C, C = 1/(2*\pi*F*X_C).$$

Figure 8:
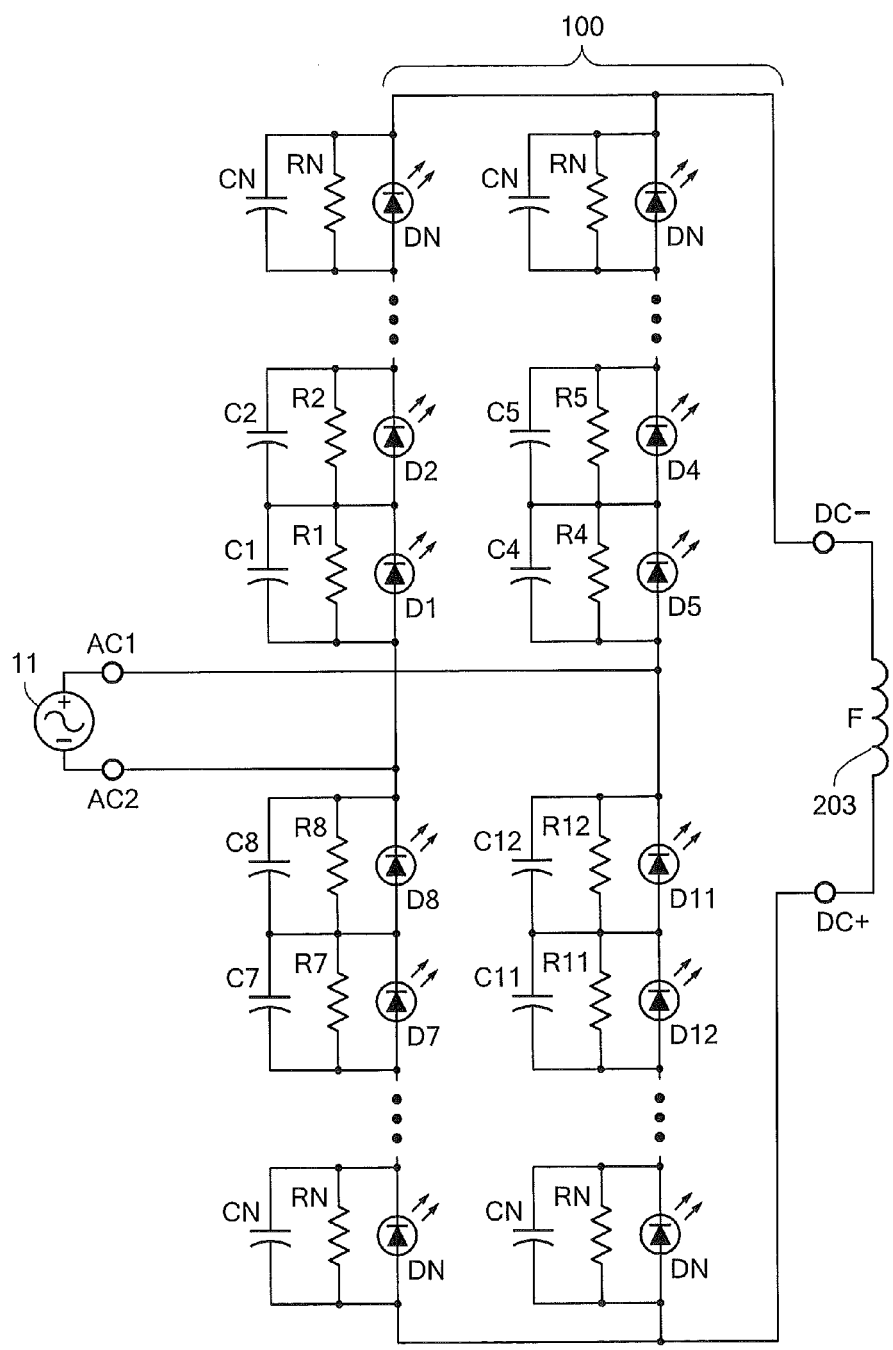

FIG. 8 depicts a solid state light engine according to an embodiment of the present invention wherein the current limiting module 200 is configured such that the resistive element $R_L$ of FIG. 3 is replaced with an inductor $L_L$ 203, thereby also forming a "lossless" current limiting element, wherein the reactance at the line frequency equivalent to the required resistance is given by the following equation:

$$R = X_L, L = X_C/(2*\pi*F).$$

Figure 9:
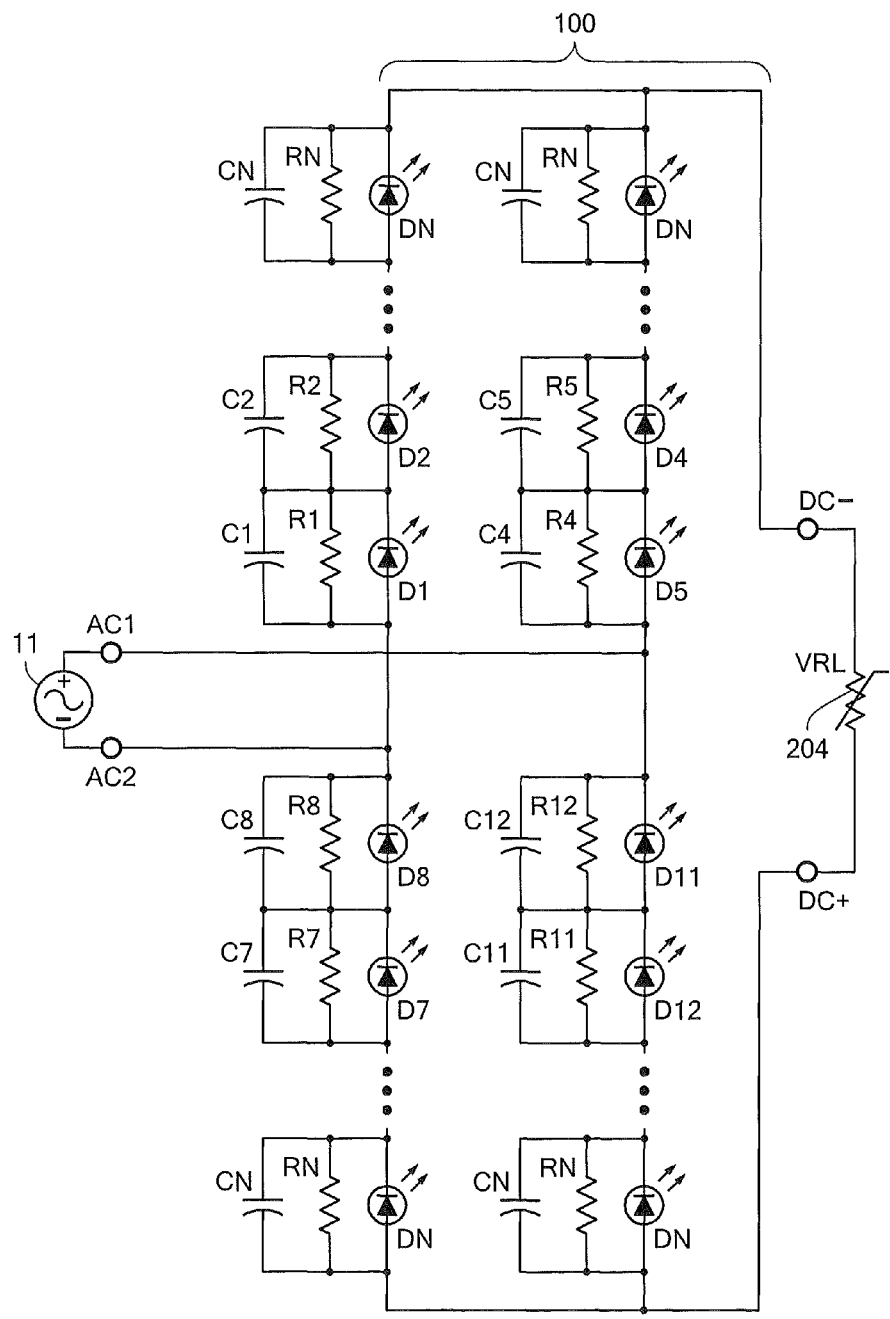

FIG. 9 depicts a solid state light engine according to an embodiment wherein the current limiting module 200 is configured such that resistor $R_L$ of FIG. 3 is replaced with a positive temperature coefficient varistor $VR_L$ 204, to provide improved current limiting under widely varying AC voltage amplitude.

Figure 10:
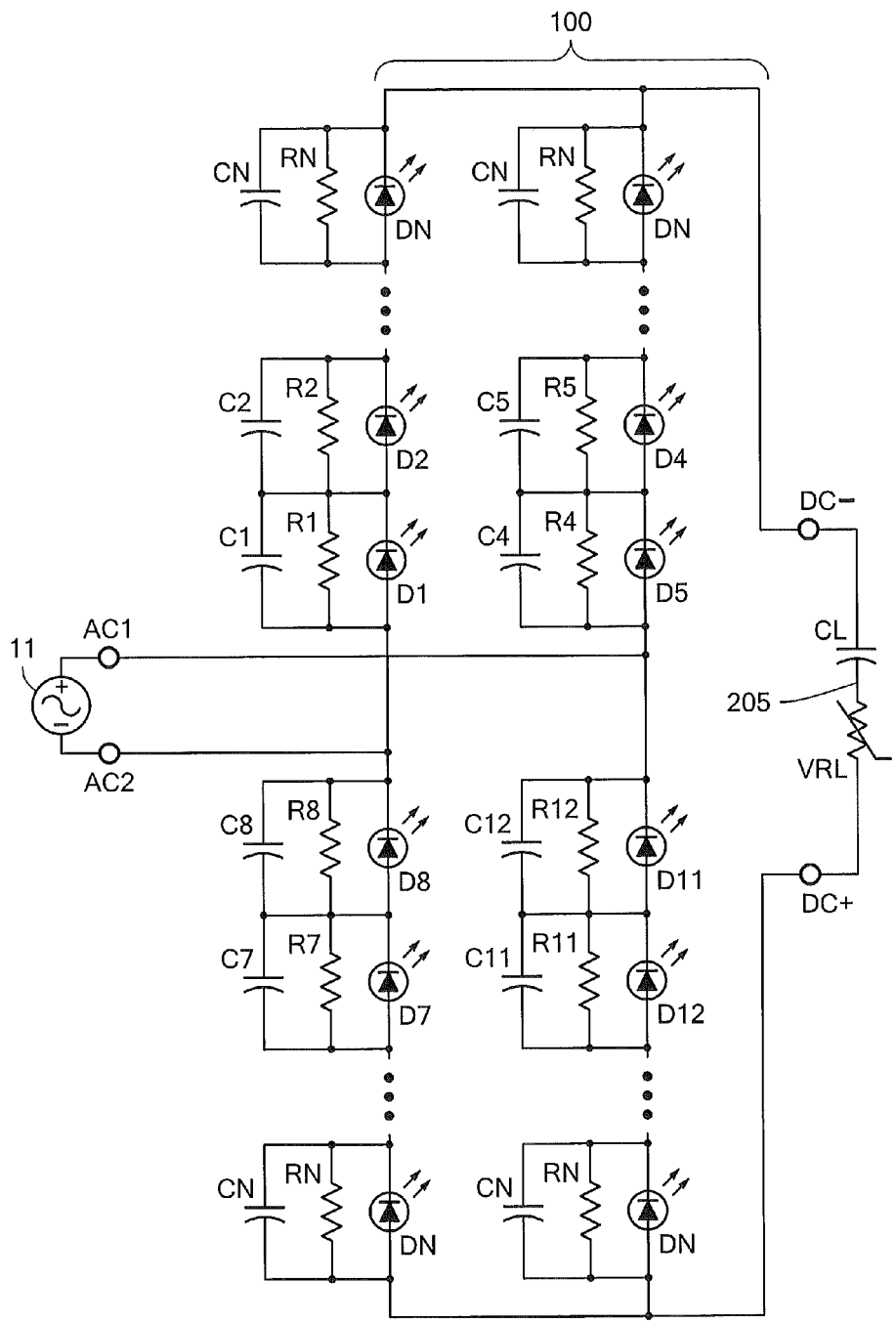

FIG. 10 depicts a solid state light engine according to an embodiment wherein the current limiting module 200 is configured such that resistor $R_L$ of FIG. 3 is replaced with the series combination of a capacitor $C_L$ with a negative temperature coefficient varistor $VR_L$ 205 to provide spike current protection and improved efficiency.

Figure 11:
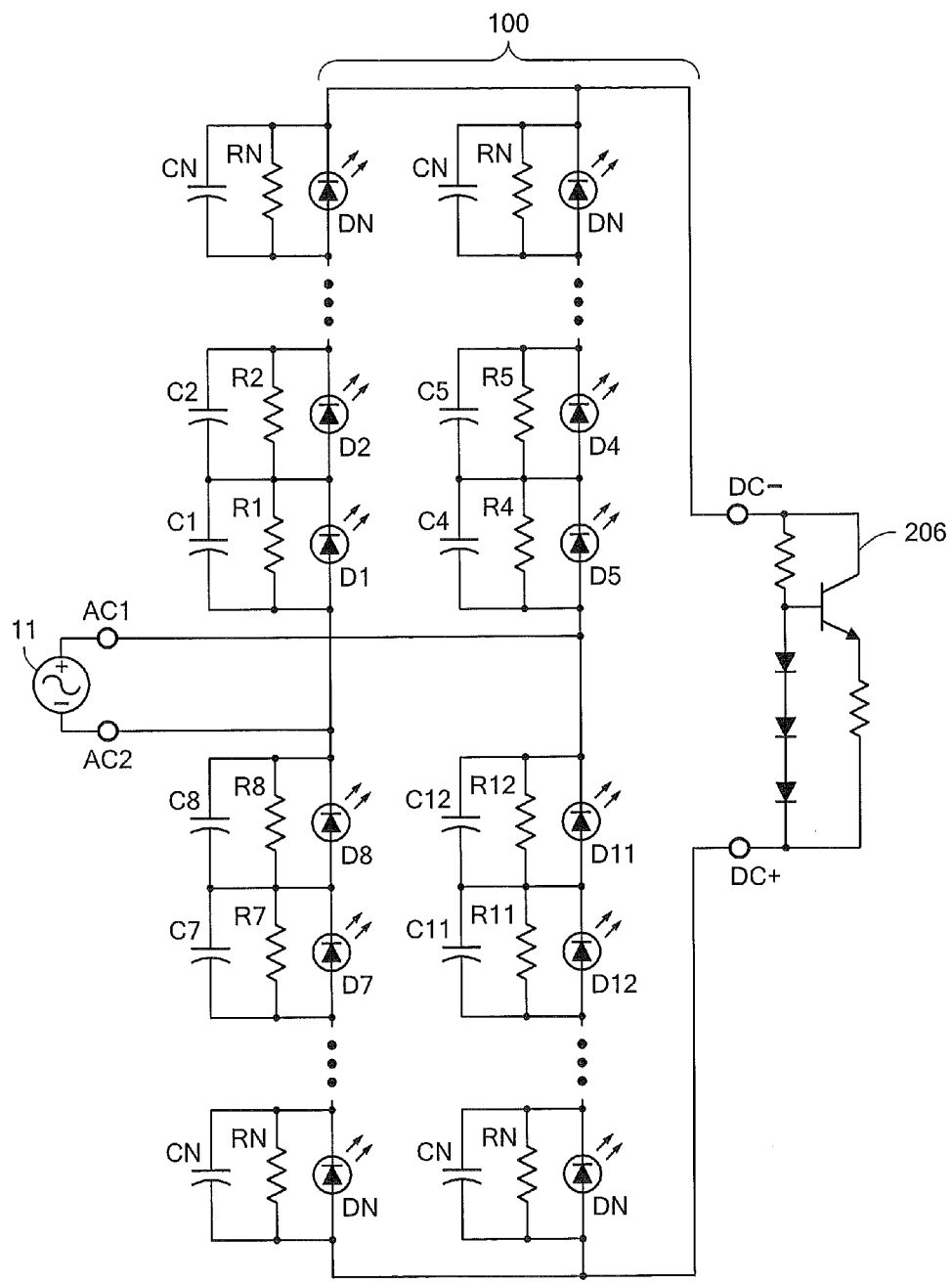

FIG. 11 depicts a solid-state light engine arrangement according to an embodiment wherein the current limiting module 200 comprises a current regulation circuit 206, having a peak limit. This is possible since the current regulated by this circuit is on the rectified or DC side of the light engine, and the regulator will only see a pulsating DC current. As such, this type of regulator would typically be difficult to realize if it were required to be directly linked with AC current. This same circuit can be used to realize active current regulation to maintain nearly constant light output in response to varying AC amplitude, or to realize peak current limiting (clipping) for light engine protection under the same conditions, for improved efficiency.

One having ordinary skill in the art will appreciate that alternative current limiting elements may be used in accordance with the solid-state light engine arrangement of embodiments of the invention.

Figure 12:
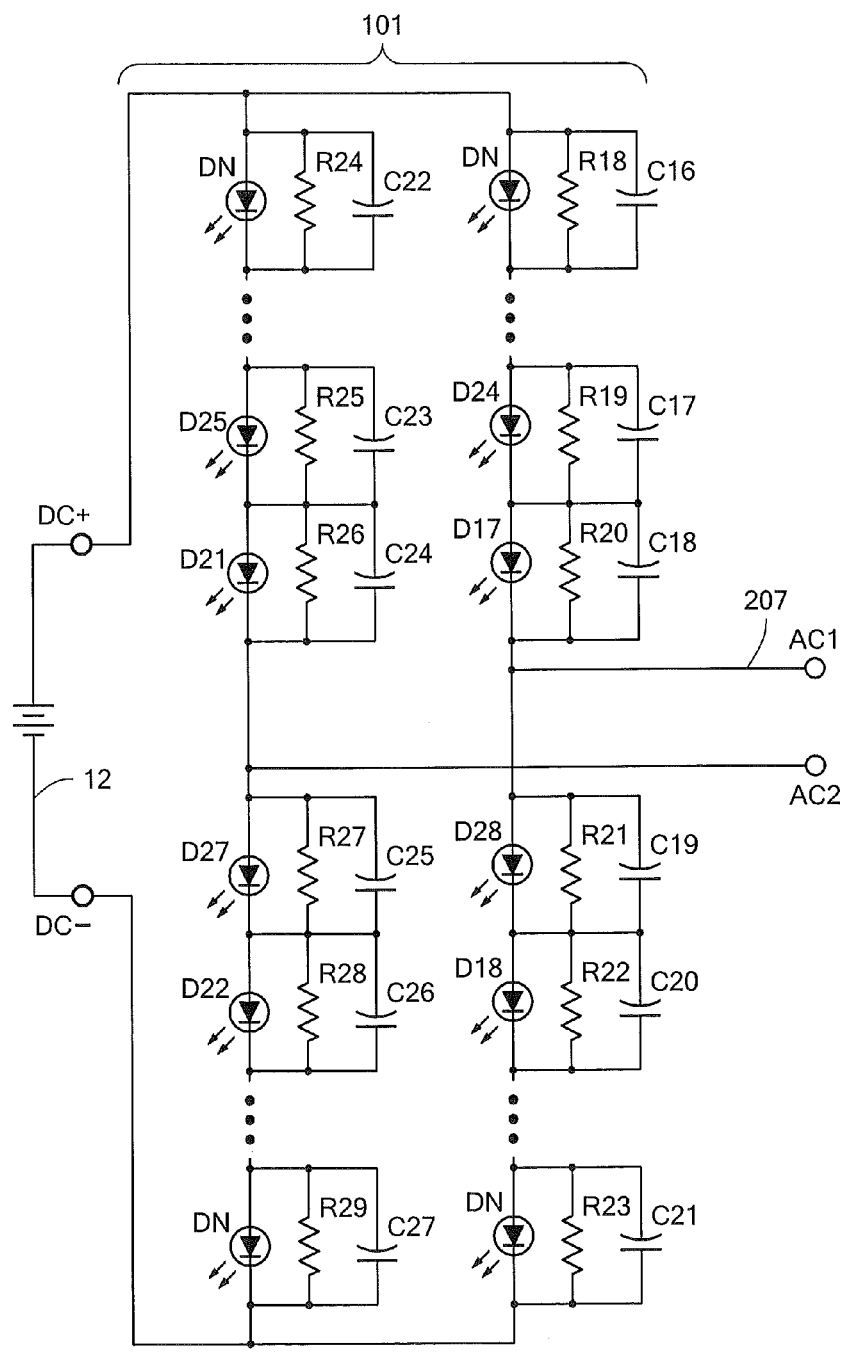
FIG. 12 is a circuit diagram of a solid state light engine, being powered by a DC power source, in accordance with embodiments of the invention.

According to an embodiment of the invention, the circuit pictured in FIG. 3 can be alternatively powered by applying a DC bias from DC+ to DC−, as is depicted in FIG. 12. In this embodiment, there would be no AC power source connected to AC3 and AC4. DC power supply module 12 supplies power to LED bridge rectifier 101. This allows the embodiment of the light engine discussed above to be powered by "conventional" (i.e., via DC voltage supplies) methods. Such a configuration is also desirable to test the light engine, because it is simpler than procuring and using a current-controlled, sinusoidal power source.

Figure 13:
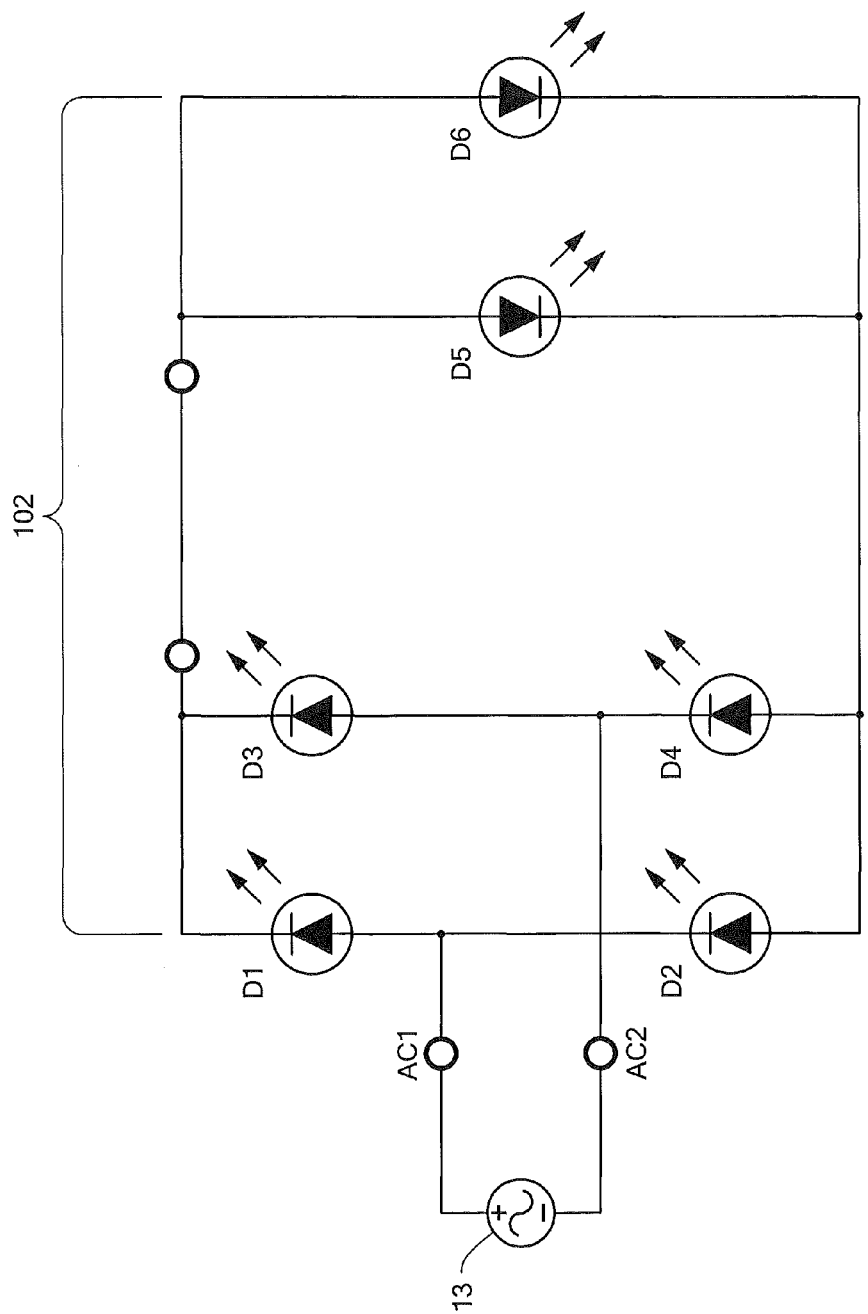
FIGS. 13-17 are circuit diagrams of solid state light engines, each being driven by a low voltage AC power source, in accordance with embodiments of the invention.
Figure 14:
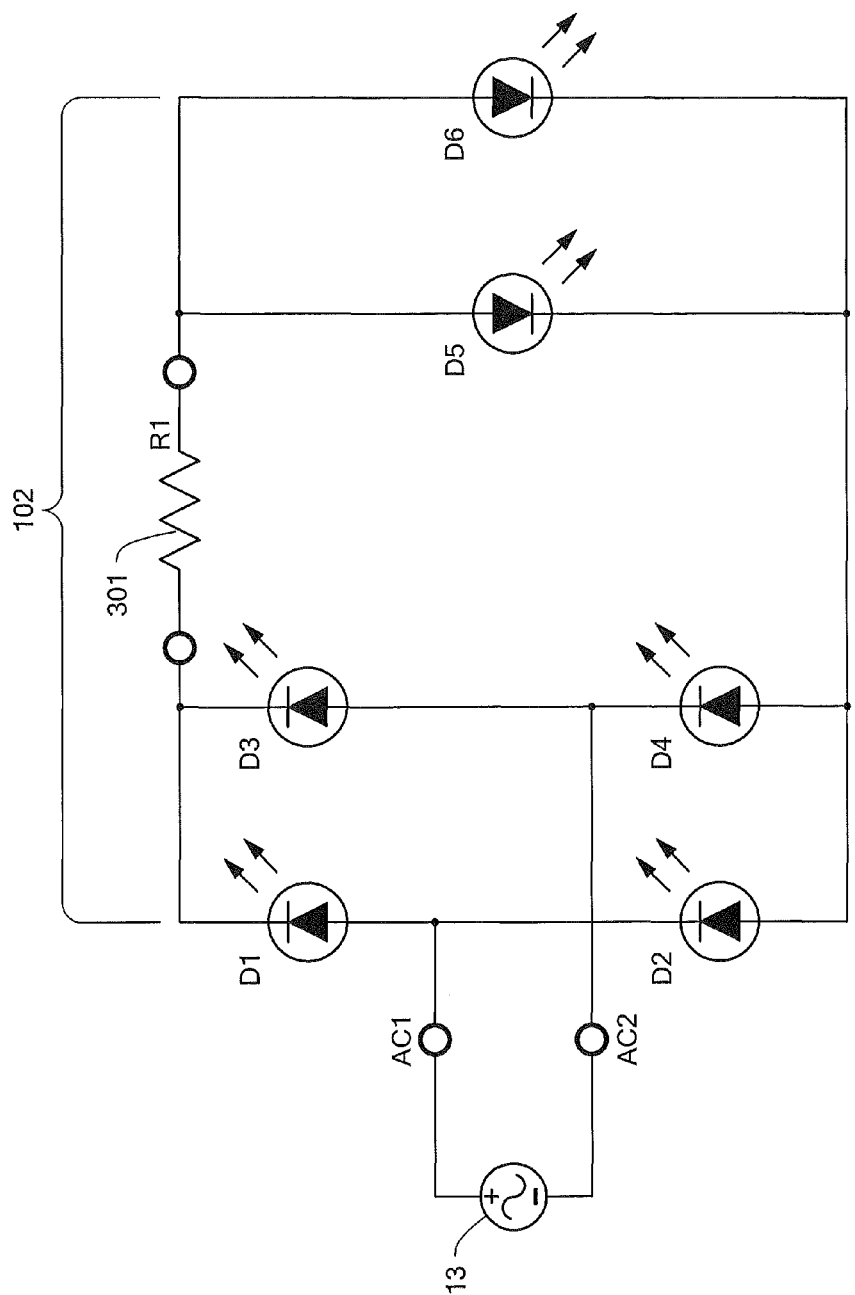
Figure 15:
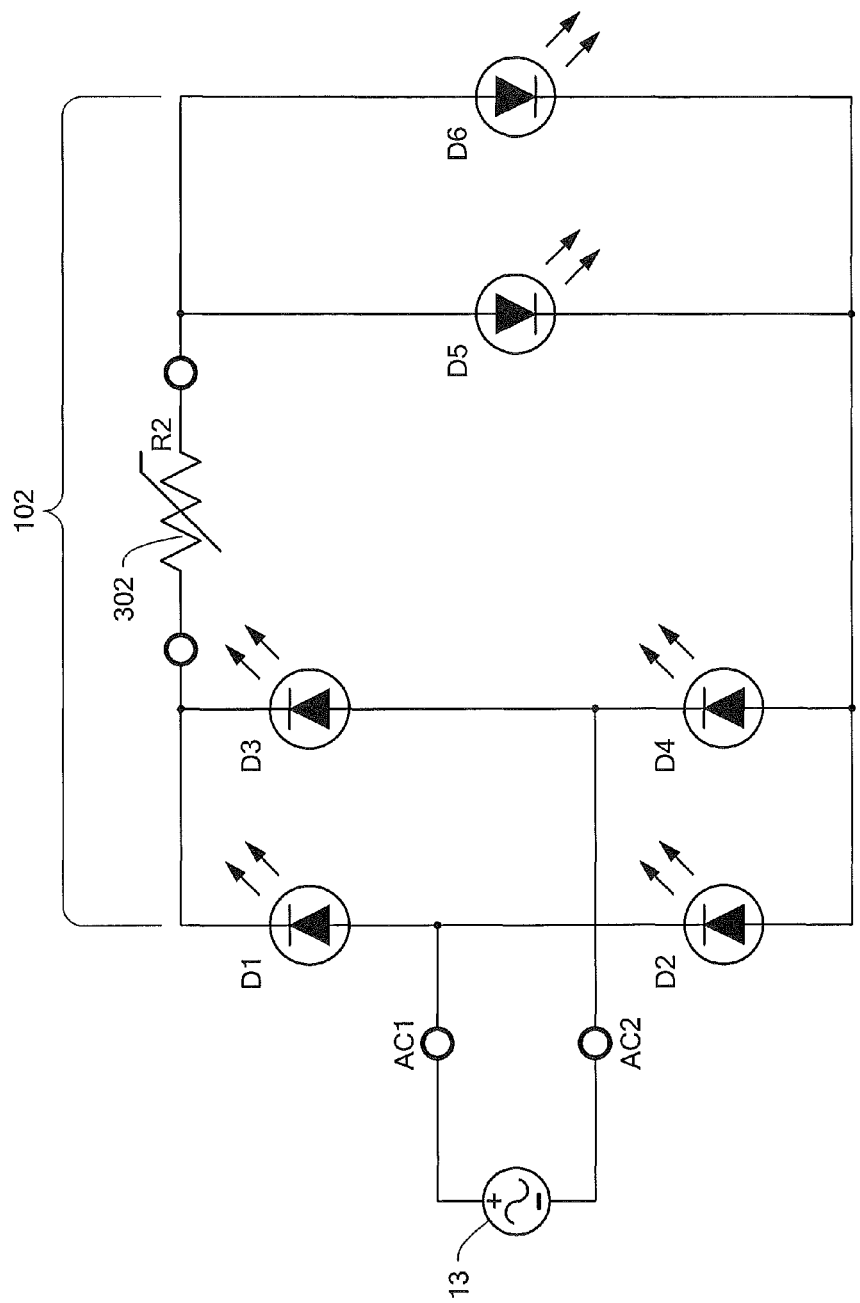
Figure 16:
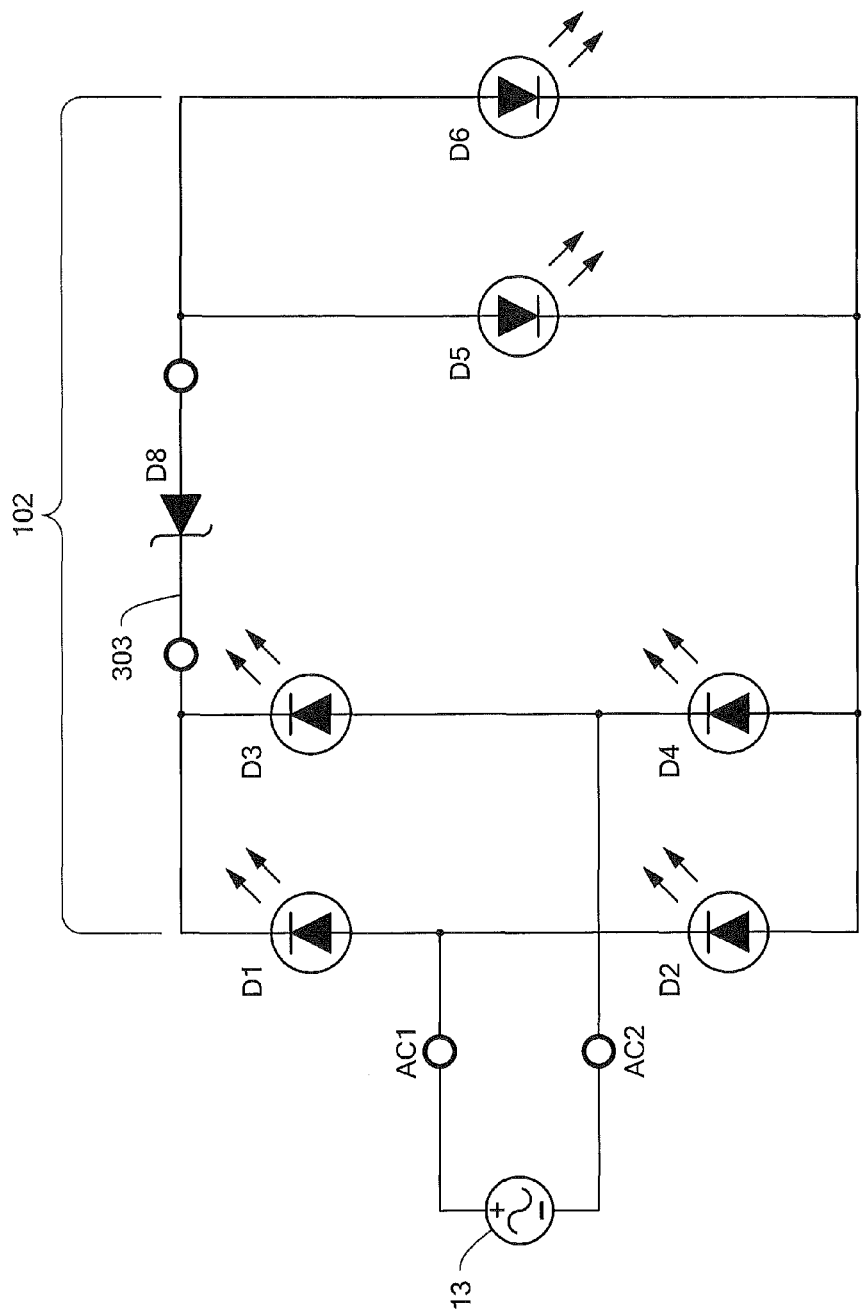
Figure 17:
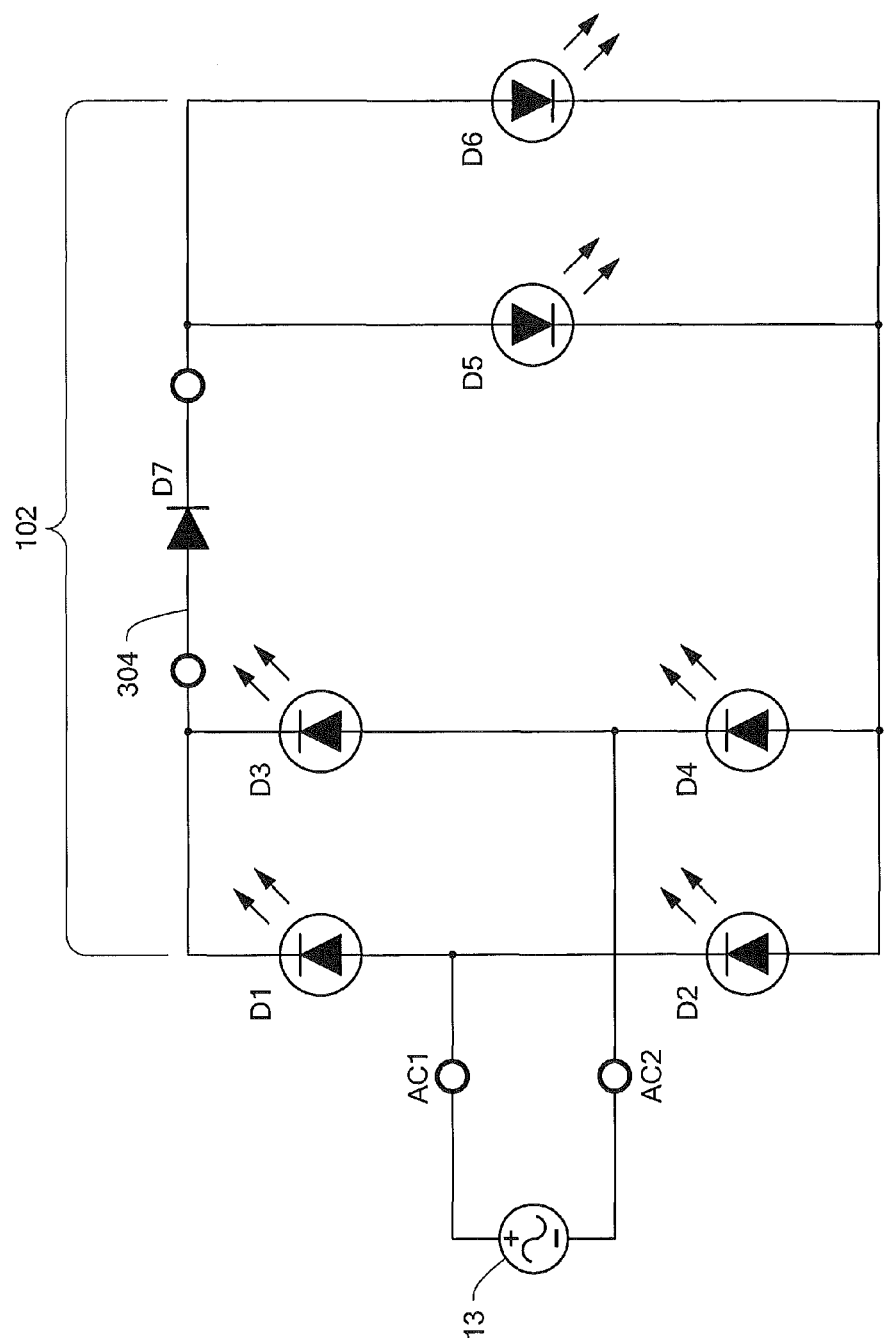

FIG. 13 illustrates an exemplary embodiment as applies to a low-voltage AC input application. In this embodiment, a low voltage AC power supply module 13 provides power to LED bridge rectifier 102. In this embodiment, the current limiting elements are inherent to the LED bridge rectifier 102 and are included in the same package. LEDs D1 through D4 form the rectifier bridge and feed LEDs D5 and D6, which are connected in parallel across the DC output terminals and act as the current limiting module. Each D1/D4 and D2/D3 diode pair in the bridge conducts on alternate half cycles of the AC input and see the full peak current. Since the diode pairs conduct on half cycles, the duty factor seen by these LEDs is one-half the total duty factor referenced previously. This allows a higher than typical sinusoidal peak current with the resulting root-mean-square (RMS) current reduced by the duty factor. LEDs D5 and D6 see both half cycles but share the peak current, each seeing ½ $I_{pk}$, so the power dissipated is nearly equally distributed among the six LEDs. Using the LEDs on the rectified DC output side of the light engine has the benefit that, in addition to the LEDs being current-limiting elements, they also contribute to the total light output. This helps maximize efficiency. The embodiment shown is directly compatible with power supply modules 13 having low voltage AC lines in the 9 VAC to 12 VAC range, which is a popular low voltage lighting range. If required, a small resistance or voltage drop can be inserted in the DC path to trim the peak current to the desired level. The use of germanium, Schottky, Schottky Barrier, silicon or Zener diodes can provide voltage trimming from about 0.25 Volt to several Volts. A positive temperature coefficient varistor can provide peak current limiting under widely varying AC line amplitude. Alternative embodiments to the low voltage AC circuit of FIG. 13 are depicted in FIG. 14 (with inline resistor R1

301), 15 (with inline positive temperature coefficient varistor VR$_L$ 302), 16 (with inline Zener diode D8 3031, and 17 (with inline diode D7 304).

Figure 18B:
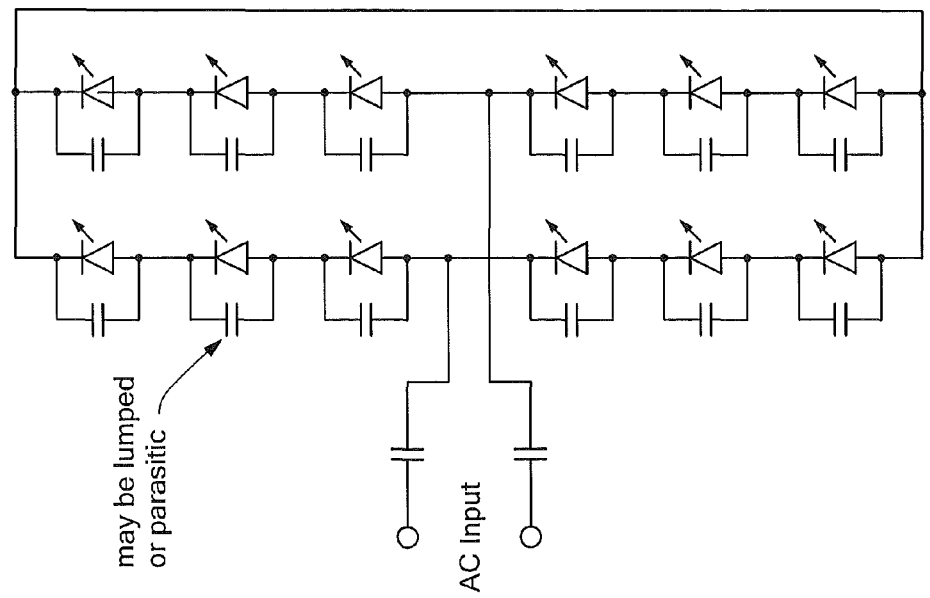
FIGS. 18a-18d are circuit diagrams of alternate implementations of solid state light engines, in accordance with embodiments of the invention.
Figure 18A:
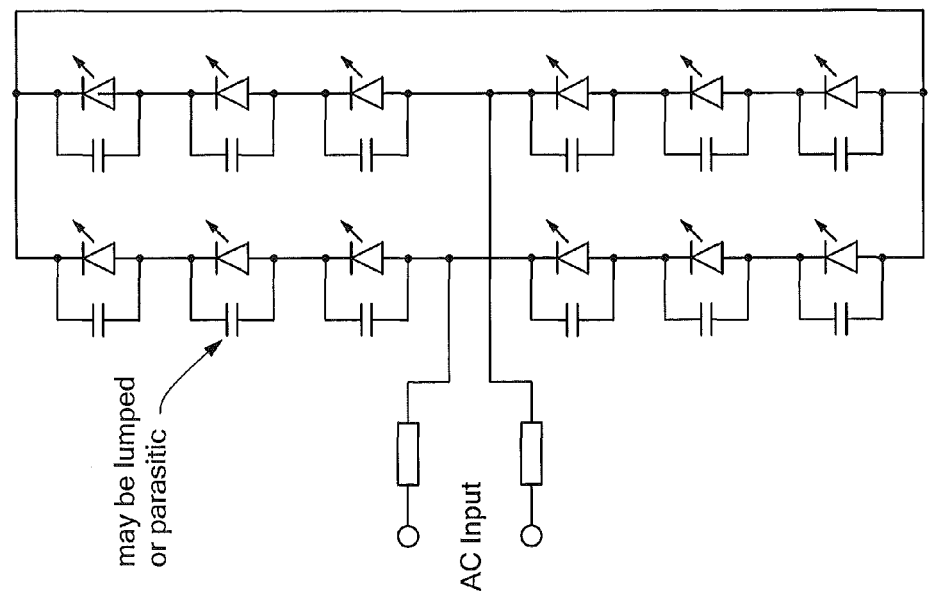
Figure 18D:
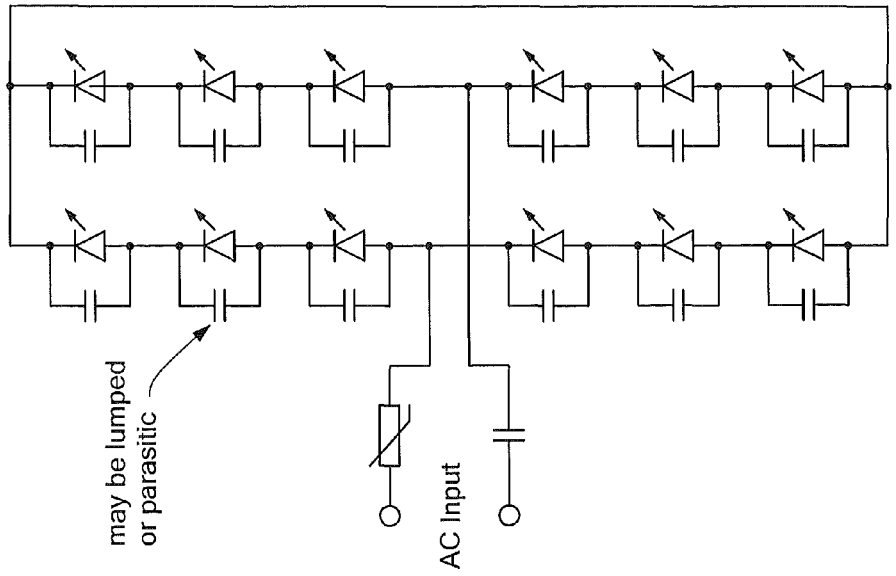
Figure 18C:
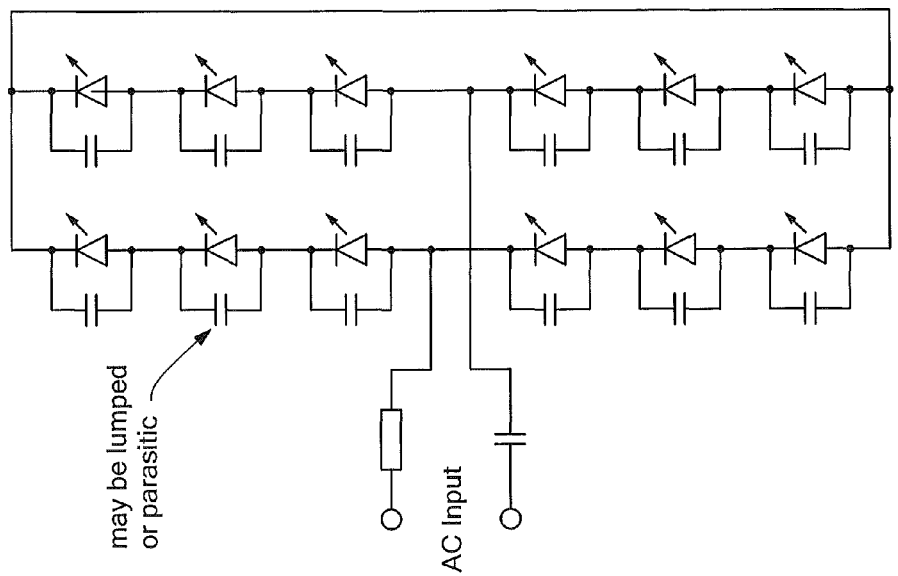

FIGS. 18*a* through 18*b* illustrate alternative superposition equivalents of the solid state light engine emitter arrangements described above and depicted in previous figures.

The above described LED bridge rectifier light engine can be manufactured using any method suitable for the assembly of LED arrays, including the use of pre-packaged LEDs mounted on conventional printed wiring boards with other components. Alternatively, the above described LED bridge rectifier light engine can be manufactured in prepackaged integrated arrays where LED dice are mounted on thermally-conductive substrates for heat management and integrated with other components.

Preferably, the LED bridge rectifier light engine is made using packaging methods suitable for high temperature operation LED light engines. In a typical high temperature package, LED dice are mounted, directly or indirectly, on a metal substrate layer that serves as a heat spreader or sink. Alternatively, non-metallic materials with proper heat conduction and strength properties may be used instead of a metal layer. The circuit traces in a high temperature package may be embedded in or imposed on ceramic layers or contained in a conventional printed wiring board layer or layers overlying the metal layer. The LED dice may be electrically connected to the circuit traces through methods known in the art, including use of lead frames, bonding wires, or other known methods. Other electronic components may be mounted on the ceramic layers or printed wiring board, or mounted on the metal layer, directly or indirectly through an interposing element for electrical isolation or other advantageous purposes.

In a preferred embodiment, the LED bridge rectifier light engine can be fabricated using the packaging methods, including the low temperature co-fired ceramic-on-metal (LTCC-M) technique, described in U.S. Patent Application Publication No. 2006/0006405, Mazzochette, "Surface mountable light emitting diode assemblies packaged for high temperature operation," published Jan. 12, 2006 ("Mazzochette"), the entire contents of which are hereby incorporated as if fully set forth at length herein. Although the description and diagrams in Mazzochette do not embody an LED bridge rectifier, one of skill in the art may readily adapt the disclosed packaging methods for use in the present invention.

Figure 19A:
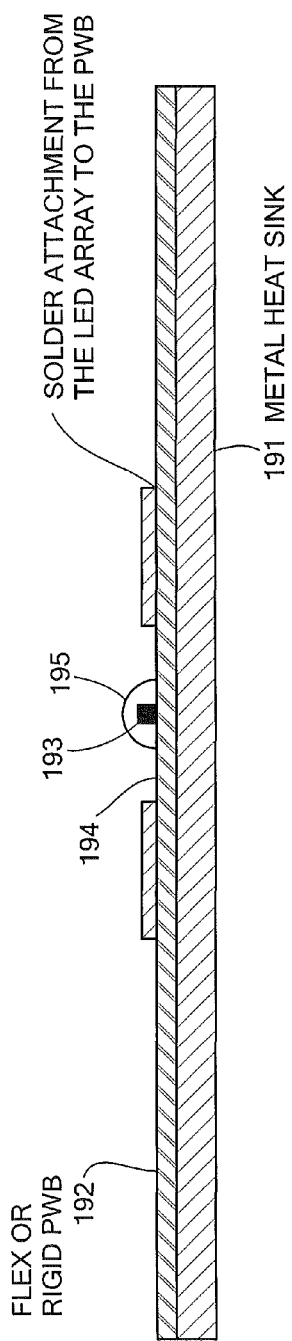
FIGS. 19a-19b are diagrams of exemplary embodiments of LED packaging for high temperature operation that may advantageously be adapted to use in the present invention.
Figure 19B:
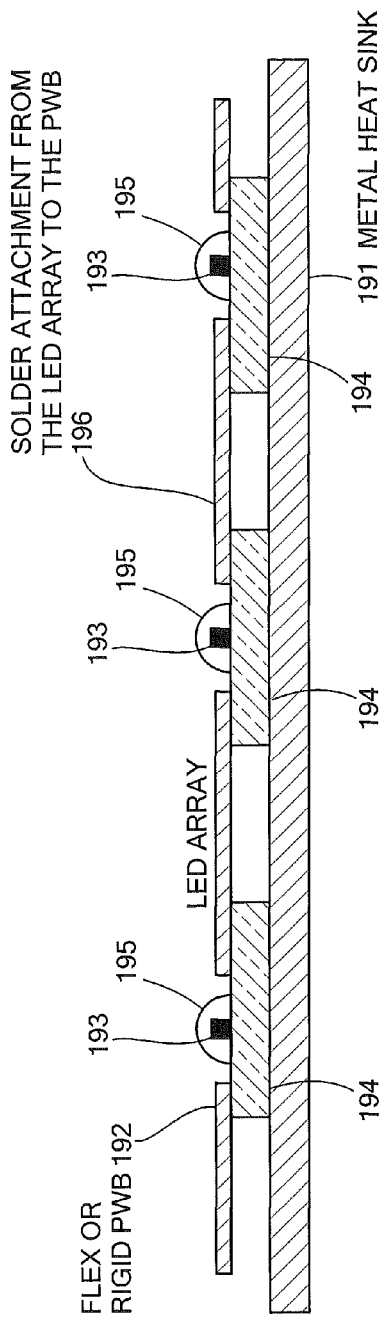

FIGS. 19*a* and 19*b* depict an alternative exemplary LED packaging method for high temperature operation that may advantageously be adapted to use with the present invention. Although the embodiments depicted in FIGS. 19*a* and 19*b* do not embody an LED bridge rectifier, one of skill in the art may readily adapt the disclosed packaging methods of FIGS. 19*a* and 19*b* for use in the present invention. In FIGS. 19*a* and 19*b*, the LED package comprises a metal layer 191, a printed wiring board (PWB) 192 having one or more layers and one or more apertures, the PWB being used to route wiring traces for interconnecting the LED dice 193 and to mount and interconnect the other components used in the LED bridge rectifier. The printed wire board 192 overlies the metal layer 191. The metal layer 191, which preferably may comprise copper, serves as a thermally conductive mounting base that manages heat generated by the LED dice 193 by spreading the heat and conducting it toward an optional external heat sink that may be mounted beneath the metal base. The package further comprises one or more isolators or interposers 194 in registration with the apertures of the PWB 192 and mounted on the metal layer 191. The LED dice 193 are mounted on the one or more isolators 194 wherein the isolators 194 comprise a material having a thermal coefficient of expansion (TCE) that matches that of the LED dice 193 mounted thereon, thus managing any thermal mechanical stresses caused by the heat generated by the LED dice 193. Suitable TCE-matching materials that may be used in accordance with the present invention include, but are not limited to, coppermolybdenum-copper (CuMoCu), tungsten-copper (WCu), aluminum-silicon-carbide (AlSiC), aluminum nitride (AlN), silicon (Si), beryllim oxide (BeO), diamond, or other material that has a TCE that is matched to that of the LED die. Optionally, an encapsulant 195 may be disposed over the LED dice 193.

It is to be understood that the exemplary embodiments are merely illustrative of the present invention. Many variations, modifications and improvements to the above-described embodiments will occur to those skilled in the art upon reading the foregoing description and viewing the Figures. It should be understood that all such variations, modifications and improvements have not been included herein for the sake of conciseness and readability, but are properly within, and are intended to be within, the scope of the invention and the following claims.

The invention claimed is:

1. A solid state light engine comprising:
   a bridge rectifier having a rectified output, and
   at least one light emitting diode (LED) connected to the bridge rectifier, the at least one LED including a die portion, a layer of phosphor free resin positioned upon the die portion, and a plurality of phosphor particles adhered to the layer of phosphor free resin;
   a pair of AC power input terminals electrically connected to the input of the bridge rectifier for use in coupling the bridge rectifier to an AC power source; and
   a pair of DC power input terminals connected to the rectified output of the bridge rectifier for use in coupling the bridge rectifier to a circuit productive of a DC voltage at the pair of DC power terminals.

2. The solid state light engine of claim 1, wherein the bridge rectifier comprises four bridge legs, each bridge leg having at least two LEDs.

3. The solid state light engine module according to claim 1, wherein the circuit comprises a DC power supply.

4. The solid state light engine module according to claim 1, wherein the circuit comprises a current limiting module.

5. The solid state light engine module according to claim 1, wherein the current limiting module is one of a resistive element, an inductor, a positive temperature coefficient varistor, a series combination of a negative temperature coefficient varistor and a capacitor, and a current regulation circuit having a peak limit.

6. A solid state light engine comprising: a bridge rectifier, including four bridge legs, each bridge leg having at least two LEDs, each of the at least two LEDs including a die portion, a layer of phosphor free resin positioned upon the die portion, and a plurality of phosphor particles adhered to the layer of phosphor free resin;
   a pair of AC power input terminals electrically connected to the input of the bridge rectifier for use in coupling the bridge rectifier to an AC power source; and
   a pair of DC power input terminals connected to the rectified output of the bridge rectifier for use in coupling the LED bridge rectifier to a circuit productive of a DC voltage at the pair of DC power terminals.

7. The solid state light engine of claim 6, further comprising: one or more LEDs electrically connected to a rectified output of the bridge rectifier.

8. The solid state light engine according to claim 6, wherein the circuit comprises a DC power supply.

9. The solid state light engine according to claim 6, wherein the circuit comprises a current limiting module.

10. The solid state light engine according to claim 9, wherein the current limiting module is one of a resistive element, an inductor, a positive temperature coefficient varistor, a series combination of a negative temperature coefficient varistor and a capacitor, and a current regulation circuit having a peak limit.

* * * * *

UNITED STATES PATENT AND TRADEMARK OFFICE
CERTIFICATE OF CORRECTION

PATENT NO.       : 8,314,565 B2  
APPLICATION NO.  : 12/504338  
DATED            : November 20, 2012  
INVENTOR(S)      : Burdalski Page 1 of 1

It is certified that error appears in the above-identified patent and that said Letters Patent is hereby corrected as shown below:

In the Specification

Column 2, line 58, delete "nay" and insert -- may --, therefor.

Column 3, line 20, delete "graphical." and insert -- graphical --, therefor.

Column 5, line 28, delete "IfPeak =(IdDC*1.57)/du" and insert -- IfPeak=(IfDC*1.57)/du --, therefor.

Column 5, line 37, delete "R=(Vin(Peak)-VfT/IfPeak." and insert -- R=(Vin(Peak)-VfT)/IfPeak. --, therefor.

Column 8, line 9, delete "beryllim" and insert -- beryllium --, therefor.

In the Claims

Column 8, line 44, in Claim 5, delete "claim 1" and insert -- claim 4 --, therefor.

Signed and Sealed this  
Eighth Day of April, 2014

Michelle K. Lee  
*Deputy Director of the United States Patent and Trademark Office*